United States Patent
Wong

[19]

[11] Patent Number: 5,880,031
[45] Date of Patent: Mar. 9, 1999

[54] METHOD FOR VAPOR PHASE WAFER CLEANING

[75] Inventor: Man Wong, Dallas, Tex.

[73] Assignee: Texas Instruments Incorporated, Dallas, Tex.

[21] Appl. No.: 904,419

[22] Filed: Jun. 25, 1992

[51] Int. Cl.[6] .................................................. H01L 21/30
[52] U.S. Cl. ........................... 438/706; 438/906; 134/1.3
[58] Field of Search ................................... 156/643, 646; 438/706, 906; 134/1.3

[56] References Cited

U.S. PATENT DOCUMENTS 5,078,832   1/1992   Tanaka ..................................... 156/646

OTHER PUBLICATIONS

Wong, Moslehi and Reed, "Characterization of Wafer Cleaning and Oxide Etching Using Vapor–Phase Hydrogen Fluoride," J. Electrochem. Soc. vol. 138, No. 6, Jun., 1991, The Electrochemical Society, Inc.

Deal, McNeilly, Kao and deLarios, "Vapor–Phase Wafer Cleaning, Oxide Etching, and Thin Film Growth," Advantage Production Technology, Inc., paper presented at First Intl. Symp. on Cleaning Technology in Semi–conductor Mfg., Fall Meeting, Electrochemical Soc., Hollywood, FL, Oct. 15–20, 1989.

Deal, Vapor–Phase Wafer Cleaning, Oxide Etching, and Thin Film Growth, First Intl. Symp. on Cleaning Technology in Semiconductor Mfg, Electrochem. Soc., Oct. 1989, pp. 1–8.

*Primary Examiner*—Robert Kunemund
*Attorney, Agent, or Firm*—Kay Houston; W. James Brady, III; Richard L. Donaldson

[57] ABSTRACT

A controlled amount of gaseous nitrogen (12) is passed over a heated azeotropic solution of hydrogen fluoride and water (16) and producing an hydrogen fluoride vapor. The hydrogen fluoride vapor is combined with gaseous hydrogen chloride (14) and then the wafers (20) are exposed to the combined vapor at low pressure and room temperature.

15 Claims, 3 Drawing Sheets

METHOD FOR VAPOR PHASE WAFER CLEANING

TECHNICAL FIELD OF THE INVENTION

This invention relates in general to the field of semiconductor wafer processing. More particularly, the present invention relates to a method for vapor phase wafer cleaning.

BACKGROUND OF THE INVENTION

Recent advances in processing equipment and technology and a more stringent requirement on substrate cleanliness have directed renewed focus at the area of vapor phase wafer processing techniques. In particular, vapor phase hydrogen fluoride has been used in oxide etching and native oxide removal applications. Other applications of the vapor phase processing technique are also eagerly sought by the semiconductor processing industry.

In a typical wafer manufacturing process, a two-step oxide strip method is used prior to the formation of the gate oxide. This conventional two-step method consists of an aqueous hydrogen fluoride strip and a conventional wet clean. The latter is a sequence of known cleaning and rinsing steps based on solutions of $HCl/H_2O_2$ and $NH_4OH/H_2O_2$.

Accordingly, it has become desirable to apply the vapor phase processing technology to replace the conventional two-step cleaning method and achieve better wafer cleaning with increased oxide lifetime and other device characteristics.

SUMMARY OF THE INVENTION

In accordance with the present invention, apparatus and a method for are provided which substantially eliminate or reduce disadvantages and problems associated with prior techniques.

In one aspect of the present invention, a method for vapor phase wafer cleaning is provided. The method includes the steps of combining hydrogen fluoride, hydrogen chloride and water vapor and exposing the wafer to the combined vapor, followed by an optional water rinse.

In another aspect of the present invention, a controlled amount of gaseous nitrogen is passed over a heated azeotropic solution of hydrogen fluoride and water and producing an hydrogen fluoride vapor. The hydrogen fluoride vapor is combined with gaseous hydrogen chloride and then the wafers are exposed to the combined vapor at low pressure and room temperature. Alternatively, three separate sources of hydrogen fluoride, hydrogen chloride and water vapor can be used.

In yet another aspect of the present invention, an inert gas is introduced at a predetermined rate into a vaporizer of a reactor containing a heated azeotropic solution of hydrogen fluoride and water to produce an hydrogen fluoride vapor. A controlled amount of gaseous hydrogen chloride is preferably combined with the hydrogen fluoride vapor before injection into a reaction chamber containing the wafers. However, the wafers may be exposed to the gaseous hydrogen chloride first and then inject the hydrogen fluoride vapor. The wafers are exposed to the vapors for a period of time.

The important technical advantage of the present invention is providing a one-step wafer cleaning process which yields significantly cleaner wafers with good electrical characteristics.

BRIEF DESCRIPTION OF THE DRAWINGS

For a better understanding of the present invention, reference may be made to the accompanying drawings, in which.

DETAILED DESCRIPTION OF THE INVENTION

Figure 1:
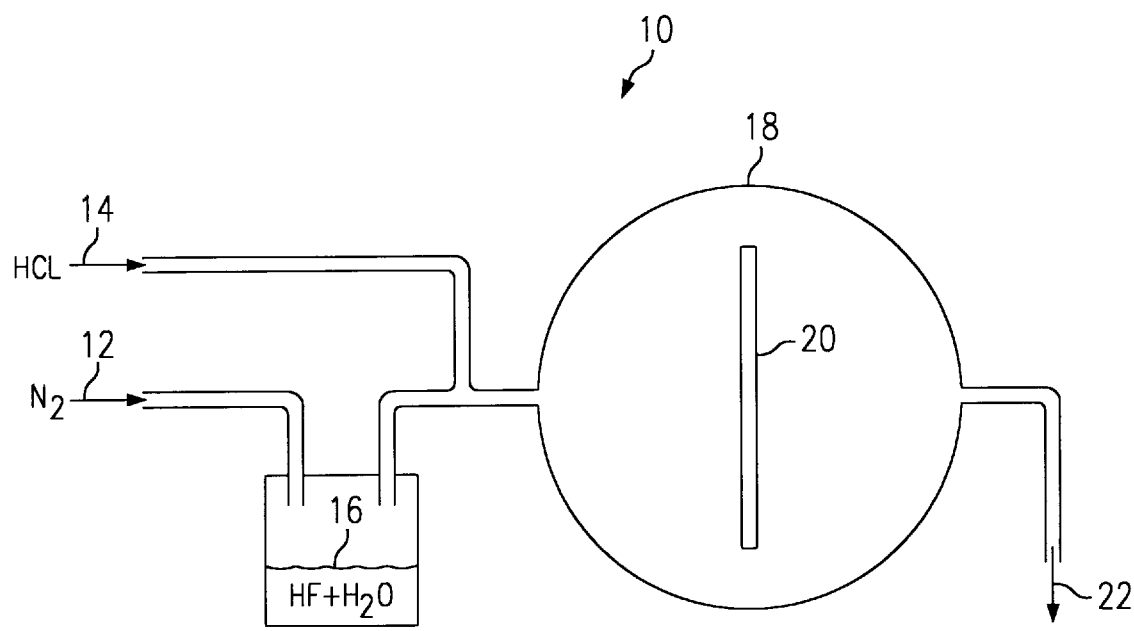
FIG. 1 is a simplified schematic of a reactor used in the vapor phase wafer cleaning.
Figure 2:
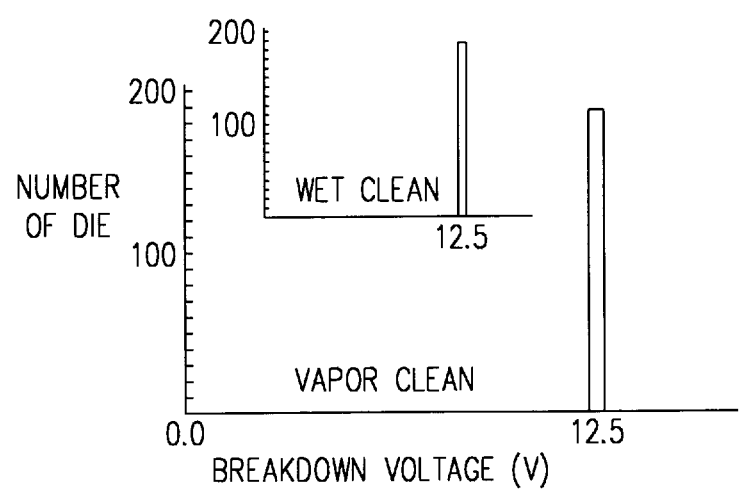
FIG. 2 are histograms of the voltage required to establish a current density of 2 $mA/cm^2$ for vapor phase cleaned and wet cleaned (inset) capacitors.

Referring to FIG. 1, a schematic illustration of the present vapor phase clean process is shown. The process is shown using an inert SiC reactor 10. SiC reactors 10 are described in various literature such as "First International Symposium on Cleaning Technology in Semiconductor Device Manufacturing" by Deal et al. and edited by Ruzyllo et al., PV 90-9, p. 121, The Electrochemical Softbound Proceedings Series, Pennington, N.J. (1990); and "Characterization of Wafer Cleaning and Oxide Etching Using Vapor-Phase Hydrogen Fluoride" by Wong et al. in *Journal of the Electrochemical Society*, 138(6):1799, June 1990. Such reactors are also commercially available from companies such as Genus, Inc. of Mountain View, Calif.

In the present vapor phase cleaning process, gaseous nitrogen $N_2$ 12 is introduced and passed over a heated azeotropic hydrogen fluoride and water solution 14, $HF/H_2O$, shown contained in a vaporizer. The $HF/H_2O$ mixture 14 may be 38.26% hydrogen fluoride by weight, or the hydrogen fluoride to water ratio may be approximately 40:60. The nitrogen gas 12 acts as a carrier gas and may be introduced at the rate of approximately one standard liter per minute. Other inert gases may also be used as the carrier gas, such as argon (Ar). The hydrogen fluoride vapor is then combined with gaseous hydrogen chloride HCl 16 before being introduced into a reactor chamber 18. Gaseous hydrogen chloride 16 is preferably introduced at the rate of one to five standard liters per minute. Reactor chamber 18 contains a wafer or wafers 20 which is exposed to the incoming vapor combination of hydrogen chloride and hydrogen fluoride. The chamber 18 is maintained at room temperature and low process pressure, ranging between 1 torr and 550 torr. The exposure duration is dependent on the application of the cleaning process, but is typically under 10 seconds.

Following exposure to the vapor combination, chamber 18 is rapidly pumped down to evacuate liquid and gases in the chamber 18. The wafers 20 can then be optically rinsed with deionized water, dried and subjected to subsequent processing steps.

The present process may be used as a general cleaning step. In particular, the process may be used prior to oxidation or chemical vapor deposition. The oxide layer removed by the process may be native oxide deposited or thermally grown oxide. Rather than the preferred simultaneous injection of the hydrogen fluoride vapor and hydrogen chloride into the chamber 18, a sequential introduction of hydrogen chloride and hydrogen fluoride vapor may also be employed.

The data presented below are based on experiments performed on 25 nm dummy oxide grown on boron-doped 5–10 Ω-cm (100)-oriented silicon wafers. However, the present vapor phase cleaning process is not so limited and is applicable to wafers of other configurations. The discussion below primarily operates to illustrate the characteristics and performance of the instant vapor phase cleaning process.

For electrical characterization, LOCOS isolated MOS-CAPs with 450 nm $POCl_3$-doped polysilicon gate were fabricated on the boron-doped substrate. The area of the capacitors varies from $5\times10^{-5}$ to $1\times10^{-2}$ $cm^2$. Prior to the formation of the gate oxide at 900° C. in a dry oxygen ambient, the dummy oxide layer was stripped using either the present $HCl/HF/H_2O$ mixtures or conventional aqueous HF. The symbols used in FIGS. 2–5 are summarized in a table below.

| SYMBOL | PROCESS STEPS |
| --- | --- |
| WC1 | vapor phase strip; convention wet clean |
| WC2 | aqueous HF strip; conventional wet clean |
| VPn | vapor phase strip; vapor phase strip followed by deionized water rinse |
| WCVP | aqueous HF strip; conventional wet clean; vapor phase chemical oxide etch |

Symbols WC and VP are used to denote the various process splits. Process WC1 consists of a vapor phase strip followed by a conventional wet clean. The latter is a sequence of cleans based on solutions of $HCl/H_2O_2$ and $NH_4OH/H_2O_2$, typically executed in the conventional reverse RCA order. Process WC2 is identical to WC1, except for the replacement of the vapor strip by the HF solution strip. The VPn processes are pure $HCl/HF/H_2O$ vapor strips, without any wet cleans before or after the dummy oxide etch. Process WCVP is WC2 followed by a vapor phase chemical oxide etch. The capacitors received neither post-oxidation inert ambient nor post-metallization forming gas anneals. No HCl was injected during the growth of the 12 nm gate oxide.

The capacitors were screened for low-field breakdown using a gate current density criterion of 2 $mA/cm^2$. It is evidenced in FIG. 2 that the vapor phase strip did not result in any low-field breakdown, and a voltage distribution comparable to that of the WC2 cleaned capacitors was obtained. Though a slight relative shift in the current-voltage characteristics was consistently observed.

Figure 3:
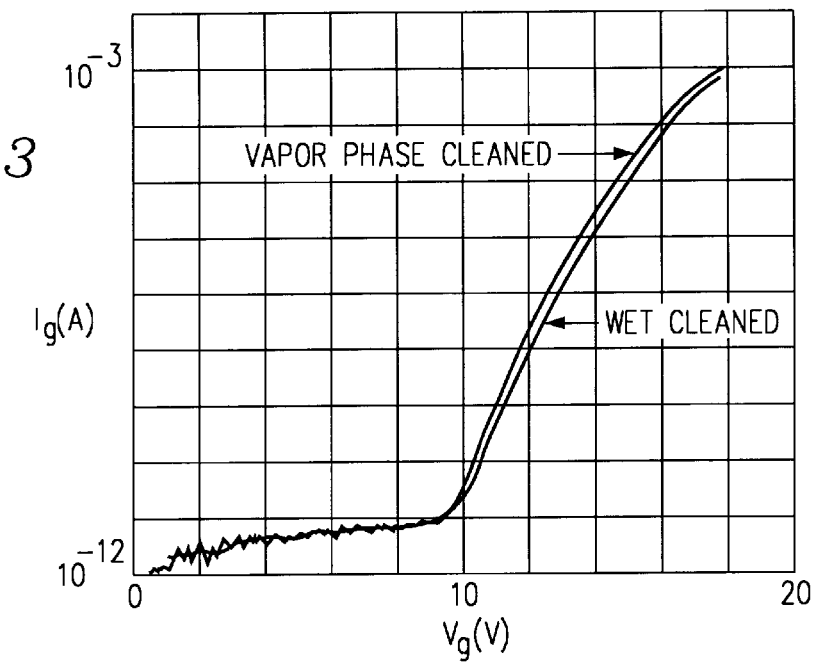
FIG. 3 is a plot showing tunnel current-voltage characteristics of oxides grown after the conventional strip clean WC2 and the vapor phase HCl/HF clean VP4.
Figure 4:
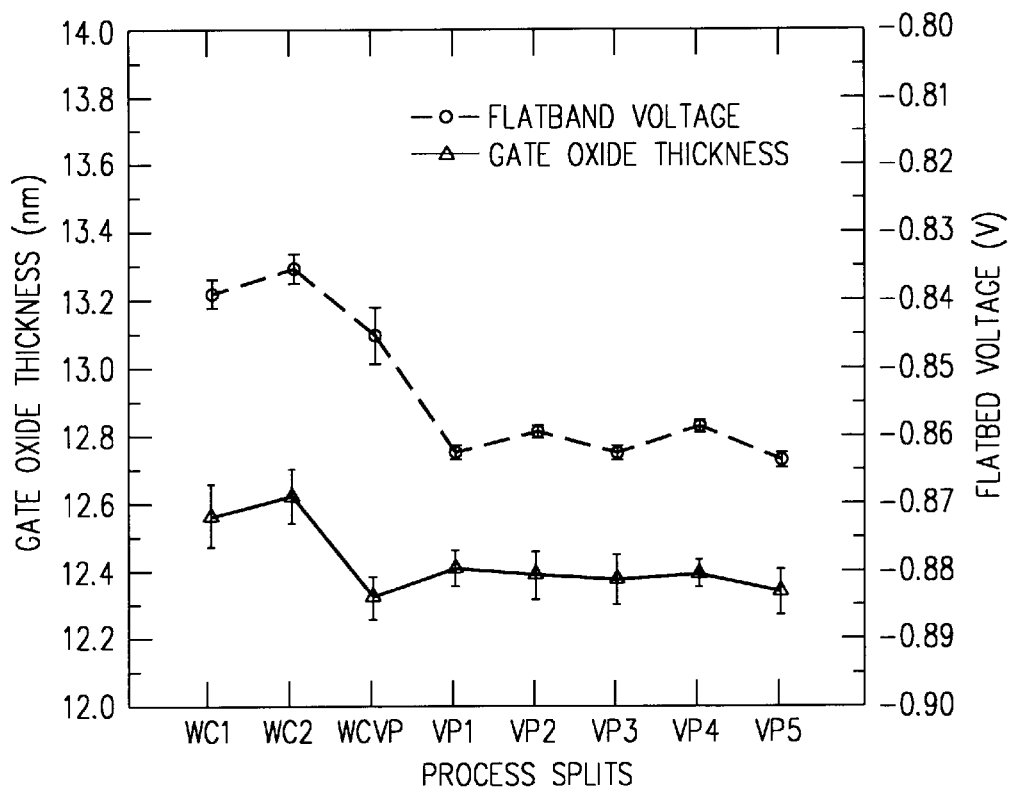
FIG. 4 is a plot showing the dependence of the gate oxide thickness and the flat-band voltage on the clean methods.
Figure 5:
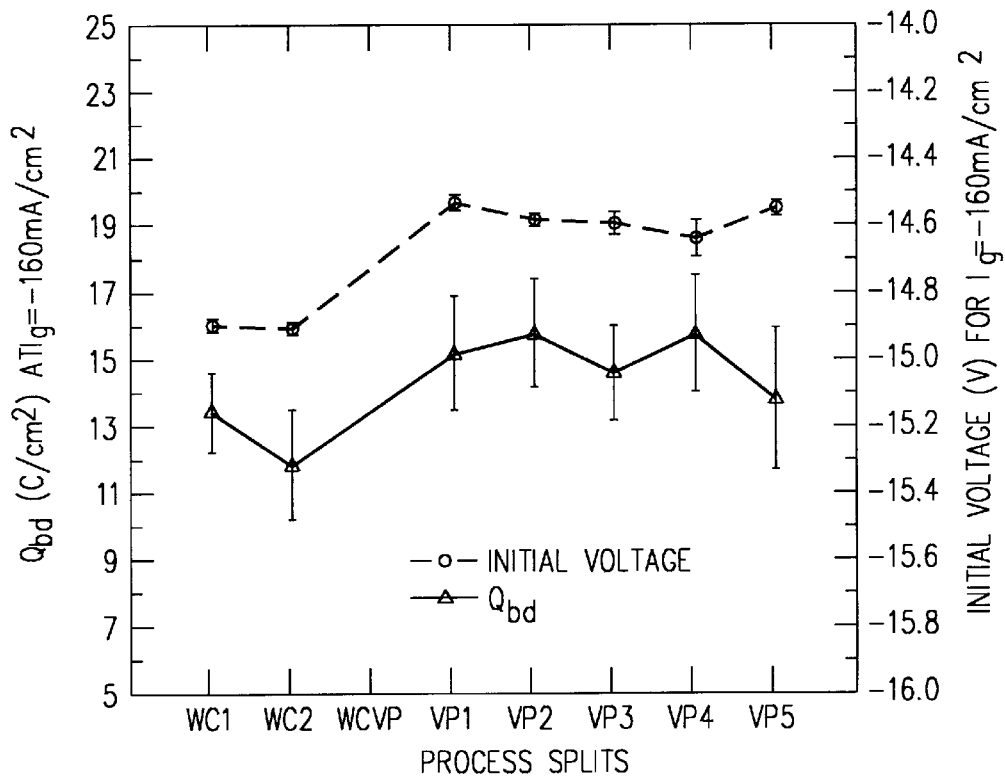
FIG. 5 is a plot showing the dependence of $Q_{bd}$ and the initial applied voltage on the clean methods.

FIG. 3 shows that the current-voltage (I–V) characteristics are essentially unchanged when the sequence of wet strip and clean was replaced by the vapor phase strip. The observed small parallel shift in the I–V curves is consistent with the slightly thicker gate oxide and the slightly more positive flat-band voltage (FIG. 4) associated with the capacitors that received a final wet clean. A definitive relationship between the different oxide parameters (gate oxide thickness and flatband voltage) and the different pretreatments has not been established; consequently the possible effects of nonuniformity in the oxidation process cannot be ignored.

A constant current stress was used to test the reliability of the oxide. The charge to breakdown $Q_{bd}$ and the initial voltage needed to establish the stress current level are plotted in FIG. 5. Compared with $Q_{bd}$ of the capacitors that received the conventional wet strip and clean, a 20% improvement was obtained for the ones that received the vapor phase strip. The capacitors subjected to the WCVP clean showed exceptionally low values of $Q_{bd}$, indicating a possible detrimental interaction between the wet clean and the subsequent vapor phase chemical oxide strip. A slightly higher initial voltage is again required for the capacitors that received the conventional wet clean, consistent with the interpretation of a thicker gate oxide.

Figure 6:
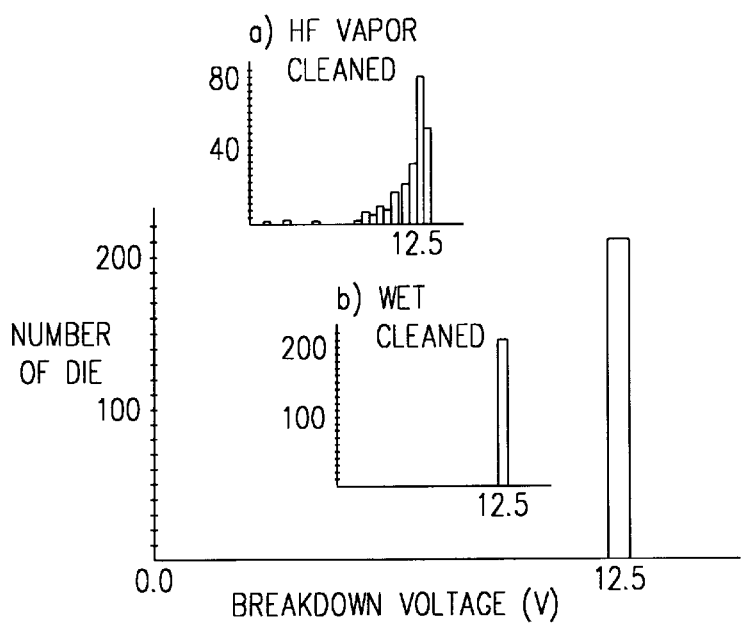
FIG. 6 are histograms comparing voltages required to establish a tunnel current density of 2 $mA/cm^2$ for vapor phase HCl/HF, vapor phase HF (inset a), and conventional wet clean (inset b) treatments.

An experiment was designed to investigate whether or not the vapor phase HCl/HF mixture actively cleaned the device surfaces. Following the same procedure as outlined before, capacitors were fabricated up to the formation of the dummy oxide. Subsequently, the wafers were coated with photoresist, UV baked, ashed, and the dummy oxide stripped with vapor etchants. Both $HCl/HF/H_2O$ and $HF/H_2O$ vapors were investigated. The capacitors were screened by ramping and monitoring the voltage needed to reach a set current level. The results, displayed in FIG. 6, indicate that the HF-only vapor does not lead to significant cleaning of the contaminants left after the ash. Consequently, it is possible that such vapor, being cleaner than the solution from which it is derived, merely introduced less contaminants onto the device surface during the strip. On the other hand, the inclusion of HCl in the vapor resulted in significant tightening of the voltage distribution, comparable to that of the control samples which received a conventional set $H_2SO_4/H_2O_2$ post-ash treatment. Therefore, the hydrated HCl vapor exposure, perhaps aided by the subsequent high-temperature process, actively removed residual contaminants left after the ash.

Although the present invention has been described in detail, it should be understood that various changes, substitutions and alterations can be made hereto without departing from the spirit and scope of the present invention as defined by the appended claims.

What is claimed is:

1. A method for vapor phase wafer cleaning, comprising the steps of:

combining hydrogen fluoride, hydrogen chloride and water vapor; and exposing the wafer to said combined vapor.

2. The method, as set forth in claim 1, further comprising the step of passing an inert gas over an azeotropic hydrogen fluoride and water solution to produce an hydrogen fluoride vapor.

3. The method, as set forth in claim 1, wherein the wafer is exposed to the combined vapor at room temperature and low pressure.

4. The method, as set forth in claim 1, further comprising the step of rinsing the wafer after the exposing step.

5. A method for cleaning wafers in a semiconductor manufacturing process, comprising the steps of:

passing an inert gas over a heated azeotropic solution of hydrogen fluoride and water and producing a hydrogen fluoride vapor;

combining said hydrogen fluoride vapor with gaseous hydrogen chloride; and exposing the wafer to said combined vapor.

6. The method, as set forth in claim 5, wherein the inert gas is gaseous nitrogen which is introduced at approximately one standard liter per minute, and gaseous hydrogen chloride is introduced at a rate equal or less than one standard liter per minute.

7. The method, as set forth in claim 5, wherein the azeotropic solution of hydrogen fluoride and water is composed of approximately 40:60 hydrogen fluoride to water.

8. The method, as set forth in claim 5, further comprising the step of rinsing the wafer surface after the exposing step.

9. The method, as set forth in claim 5, wherein the wafers are subjected to room temperature and low pressure during the exposing step.

10. The method, as set forth in claim 9, wherein the low pressure ranges from one torr and 550 torr.

11. A method for cleaning semiconductor wafers in a reactor, comprising the steps of:

introducing an inert gas into a vaporizer containing a heated azeotropic solution of hydrogen fluoride and water;

passing said inert gas over said azeotropic solution and producing an hydrogen fluoride vapor;

combining said hydrogen fluoride vapor with gaseous hydrogen chloride;

injecting said combined vapor into a reaction chamber containing the wafers;

exposing wafers to said combined vapor; and rapidly pumping down the etch chamber to dry the wafer surface.

12. The method, as set forth in claim 11, wherein the inert gas is gaseous nitrogen and is introduced at a rate of approximately one standard liter per minute.

13. The method, as set forth in claim 11, wherein the azeotropic solution of hydrogen fluoride and water is composed of approximately 40:60 hydrogen fluoride to water.

14. The method, as set forth in claim 11, wherein the wafers are subjected to room temperature and low pressure during the exposing step.

15. The method, as set forth in claim 14, wherein the low pressure ranges from 70 torr and 550 torr.

* * * * *